(12) United States Patent
Shim

(10) Patent No.: US 8,446,558 B2
(45) Date of Patent: May 21, 2013

(54) LIQUID CRYSTAL DISPLAY PANEL AND METHOD FOR FABRICATING THE SAME

(75) Inventor: Seok-Ho Shim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/283,111

(22) Filed: Oct. 27, 2011

(65) Prior Publication Data

US 2012/0113347 A1 May 10, 2012

(30) Foreign Application Priority Data

Nov. 4, 2010 (KR) ........................ 10-2010-0109216

(51) Int. Cl.
*G02F 1/1339* (2006.01)

(52) U.S. Cl.
USPC ......................................... 349/156; 349/155

(58) Field of Classification Search ........... 349/155–156
See application file for complete search history.

(56) References Cited

FOREIGN PATENT DOCUMENTS

| KR | 10-2008-0032323 A | 4/2005 |
| KR | 10-0710171 A | 4/2007 |

*Primary Examiner* — Phu Vu

(74) *Attorney, Agent, or Firm* — Birch, Stewart, Kolasch & Birch, LLP

(57) ABSTRACT

A liquid crystal display panel includes a column spacer formed on an upper substrate, a thin film transistor formed on a lower substrate to face the upper substrate connected to a plurality of gate lines and a plurality of data lines, a pixel electrode formed at a pixel region provided as the gate line and the data line cross, the pixel electrode connected to the thin film transistor, and a projection pattern portion formed on the gate line matched to the pixel region to have a projection formed to be in contact with the column spacer for reducing a friction area between the column spacer and the lower substrate, and a projection support pattern for preventing the column spacer from being stuck in at the time of an physical impact or vibration.

22 Claims, 24 Drawing Sheets

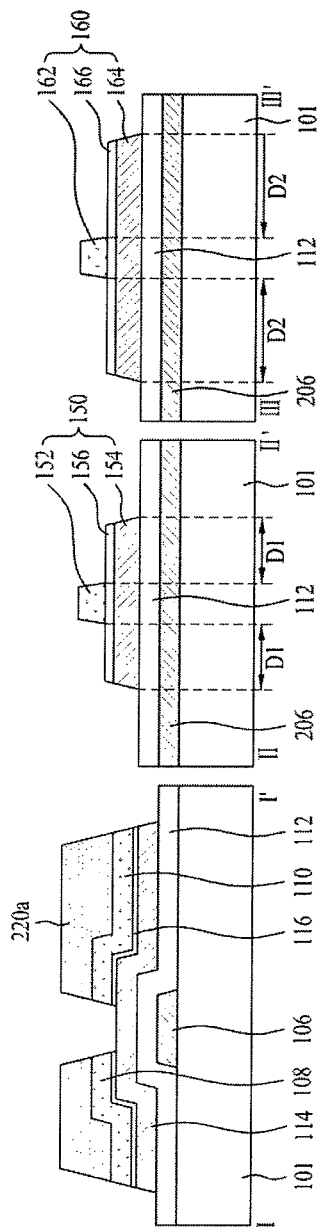

LIQUID CRYSTAL DISPLAY PANEL AND METHOD FOR FABRICATING THE SAME

CROSS REFERENCE TO RELATED APPLICATION

This application claims the priority benefit of the Korean Patent Application No. 10-2010-0109216, filed on Nov. 4, 2010, which is hereby incorporated by reference as if fully set forth herein.

BACKGROUND OF THE DISCLOSURE

1. Field of the Disclosure

The present invention relates to a liquid crystal display panel and a method for fabricating the same, and more particularly to a liquid crystal display panel which can prevent an accidental stain from taking place at the time of a physical impact or vibration for improving a display quality; and a method for fabricating the same.

2. Discussion of the Related Art

A liquid crystal display device controls light transmissivity of liquid crystals having dielectric anisotropy by an electric field to display a picture. Referring to FIG. 1 the liquid crystal display device is provided with the liquid crystal display panel 10 having a thin film transistor substrate 14 and a color filter substrate 12 bonded together to face each other, a column spacer 40 for maintaining a fixed cell gap between the two substrates 12 and 14, and the liquid crystals filled in the cell gap.

The thin film transistor substrate 14 is provided with gate lines and data lines formed to cross each other with a gate insulating film disposed therebetween on a lower substrate, a thin film transistor TFT formed at every crossed portion, a pixel electrode formed at a pixel region provided by the crossed structure, and a lower alignment film coated on above elements.

The color filter substrate 12 is provided with a color filter for producing a color, a black matrix for preventing a light from leaking, a common electrode for forming a vertical electric filed to the pixel electrode, and an upper alignment film coated on above elements for orientation of the liquid crystals.

If the physical impact is applied to the liquid crystal display panel 10, or make the liquid crystal display panel 10 to vibrate, a friction area between the column spacer 40 at the upper substrate and the lower substrate becomes larger, to press down the column spacer 40 to form the stain. In order to reduce the friction area, a projection 32 is formed on the lower substrate opposite to the column spacer so that the column spacer 40 is driven into the projection 32 and returns to an original state to reduce the stain.

However, referring to FIG. 1, if the physical impact or the vibration is heavy in a mechanical stiffness test of the liquid crystal display panel 10, as a module 22 and 20 which holds the liquid crystal display panel 10 is bent, the projection 32 and a projection support pattern 34 which support the gap in the display panel are stuck into the column spacer 40 as shown at an M region. That is, as power is concentrated at the projection 32 by the physical impact, the column spacer 40 is stuck into the projection 32, causing the stain at a region having the column spacer 40 stuck therein.

SUMMARY OF THE DISCLOSURE

Accordingly, the present invention is directed to a liquid crystal display panel, and a method for fabricating the same.

An object of the present invention is to provide a liquid crystal display panel which can prevent a stain from taking place at the time of a physical impact or vibration for improving a display quality; and a method for fabricating the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display panel includes a column spacer formed on an upper substrate, a thin film transistor formed on a lower substrate to face the upper substrate connected to a plurality of gate lines and a plurality of data lines, a pixel electrode formed at a pixel region provided as the gate line and the data line cross, the pixel electrode connected to the thin film transistor, and a projection pattern portion formed on the gate line matched to the pixel region to have a projection formed to be in contact with the column spacer for reducing a friction area between the column spacer and the lower substrate, and a projection support pattern for preventing the column spacer from being stuck in at the time of an physical impact or vibration.

In this instance, the projection pattern portion is formed on the gate lines matched with the pixel regions, formed on the gate lines matched with every second pixel regions, or formed on the gate lines matched with four corners and a center of the liquid crystal display panel.

And, the projection pattern portion is formed with a halftone mask or a slit mask in formation of a source electrode, a drain electrode, and a semiconductor pattern of the thin film transistor.

And, the projection is formed at the same time, on the same layer, and of the same material, with the source electrode and the drain electrode of the thin film transistor.

And, the projection support pattern is formed at the same time, on the same layer, and of the same material, with the semiconductor pattern of the thin film transistor.

And, the projection pattern portion includes a core portion for supporting the projection, and a tail portion formed around the core portion.

And, the tail portion of the projection support pattern has a length of 1.8 μm~5 μm.

In another aspect of the present invention, a method for fabricating a liquid crystal display panel includes the steps of forming a column spacer on an upper substrate, forming a gate electrode pattern on a lower substrate facing the upper substrate to include a gate line and a gate electrode, depositing a gate insulating film, a semiconductor layer, and a data electrode layer on the lower substrate having the gate electrode pattern formed thereon, forming first and second photoresist patterns having thicknesses different from each other on the gate insulating film, the semiconductor layer, and the data electrode layer, etching the semiconductor layer, and the data electrode layer with the first and second photoresist patterns to form a data metal pattern including a source electrode and a drain electrode, and an underlying semiconductor pattern, and a projection pattern portion having a projection with the source and drain electrodes, and a projection support pattern having a semiconductor pattern formed to have an area larger than a pressed down surface area of the column spacer when the column spacer is pressed down on the projection at the time of a physical impact or vibration, and bonding the upper substrate with the lower substrate to bring the column spacer into contact with the projection.

In this instance, the projection pattern portion includes a core portion for supporting the projection, and a tail portion formed around the core portion.

And, the tail portion of the projection support pattern has a length of 1.8 µm~5 µm for preventing the column spacer from being stuck in at the time of a physical impact or vibration.

And, the projection pattern portion is formed on the gate lines matched with the pixel regions, formed on the gate lines matched with every second pixel regions, or formed on the gate lines matched with four corners and a center of the liquid crystal display panel.

And, the step of forming first and second photoresist patterns having thicknesses different from each other on the gate insulating film, the semiconductor layer, and the data electrode layer, includes the steps of coating photoresist on the gate insulating film, the semiconductor layer, and the data electrode layer, providing a halftone mask or a slit mask including, a shielding region at a region at which the semiconductor pattern, the date metal pattern, and the projection are to be formed, to shield a UV ray, a semi-transmission region having a semi-transmission layer at a region at which a projection support pattern and a channel of the thin film transistor are to be formed, for controlling light transmissivity, and a transmission region for transmission of the UV ray completely, and forming first and second photoresist patterns with the halftone mask or the slit mask.

In another aspect of the present invention, a liquid crystal display panel includes a column spacer formed on an upper substrate, a thin film transistor formed on a lower substrate connected to a plurality of gate lines and a plurality of data lines, a pixel electrode formed at a pixel region provided as the gate line and the data line cross, the pixel electrode connected to the thin film transistor, and a projection pattern portion including a first projection pattern portion formed on the gate line matched to the pixel region, and a second projection pattern portion formed on the gate line matched to a peripheral region, or a center of the liquid crystal display panel except the gate line the first projection pattern portion is formed thereon to have an area larger than an area of the first projection pattern portion.

And, the first projection pattern portion includes a first projection provided to contact with the column spacer for reducing a friction area between the column spacer on the upper substrate and the lower substrate, and a first projection support pattern for supporting the first projection.

And, the second projection pattern portion includes a second projection provided to contact with the column spacer for reducing a friction area between the column spacer on the upper substrate and the lower substrate, and a second projection support pattern formed to have an area larger than an area of the first projection support pattern for supporting the second projection.

And, the first projection support pattern has a tail portion with a left/right direction length formed longer than a left/right direction length of a tail portion of the second projection support pattern.

And, each of the length of the tail portion of the first projection support pattern and the length of the tail portion of the second projection support pattern is 1.8 µm~5 µm for preventing the column spacer from being stuck in at the time of a physical impact or vibration.

In another aspect of the present invention, a method for fabricating a liquid crystal display panel includes the steps of forming a column spacer on an upper substrate, forming a gate electrode pattern on a lower substrate facing the upper substrate to include a gate line and a gate electrode, depositing a gate insulating film, a semiconductor layer, and a data electrode layer on the lower substrate having the gate electrode pattern formed thereon, forming first and second photoresist patterns having thicknesses different from each other on the gate insulating film, the semiconductor layer, and the data electrode layer, etching the semiconductor layer, and the data electrode layer with the first and second photoresist patterns to form a projection pattern portion including a data metal pattern having a source electrode and a drain electrode, and an underlying semiconductor pattern, a first projection pattern portion on the gate line, and a second projection pattern portion on the gate line matched to a peripheral region or a center except the gate line having the first projection pattern portion formed thereon to have an area larger than an area of the first projection pattern portion, and bonding the upper substrate with the lower substrate to bring the column spacer into contact with the first and second projections.

And, the first projection pattern portion includes a first projection provided to contact with the column spacer for reducing a friction area between the column spacer on the upper substrate and the lower substrate, and a first projection support pattern for supporting the first projection.

And, the second projection pattern portion includes a second projection provided to contact with the column spacer for reducing a friction area between the column spacer on the upper substrate and the lower substrate, and a second projection support pattern formed to have an area larger than an area of the first projection support pattern for supporting the second projection.

And, the second projection pattern has a tail portion with a length formed longer than a length of a tail portion of the first projection pattern portion.

And, each of the length of the tail portion of the first projection support pattern and the length of the tail portion of the second projection support pattern is 1.8 µm~5 µm for preventing the column spacer from being stuck in at the time of a physical impact or vibration.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 17A to 17E illustrate sections for showing the steps of forming a first and second projection patterns, a semiconductor pattern, and a data metal pattern in a method for fabricating a liquid crystal display panel in accordance with a second preferred embodiment of the present invention.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts. It is required to pay attention to that detailed description of known arts will be omitted if it is determined that the arts can mislead the present invention.

Preferred embodiment of the present invention will be described with reference to FIGS. 2 to 17E.

Figure 1:
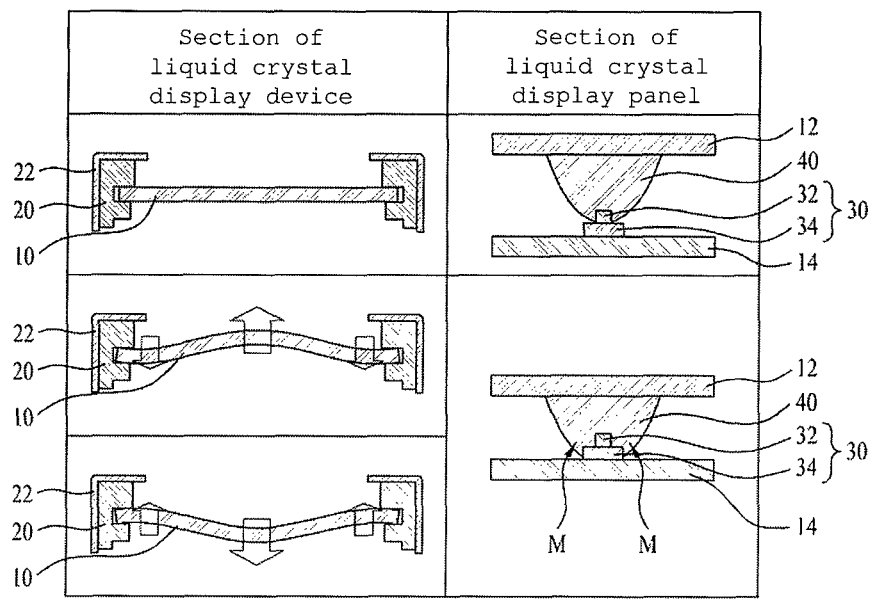
FIG. 1 illustrates sections of related art liquid crystal display panels when a physical impact or vibration is applied thereto in a mechanical stiffness test, respectively.
Figure 2:
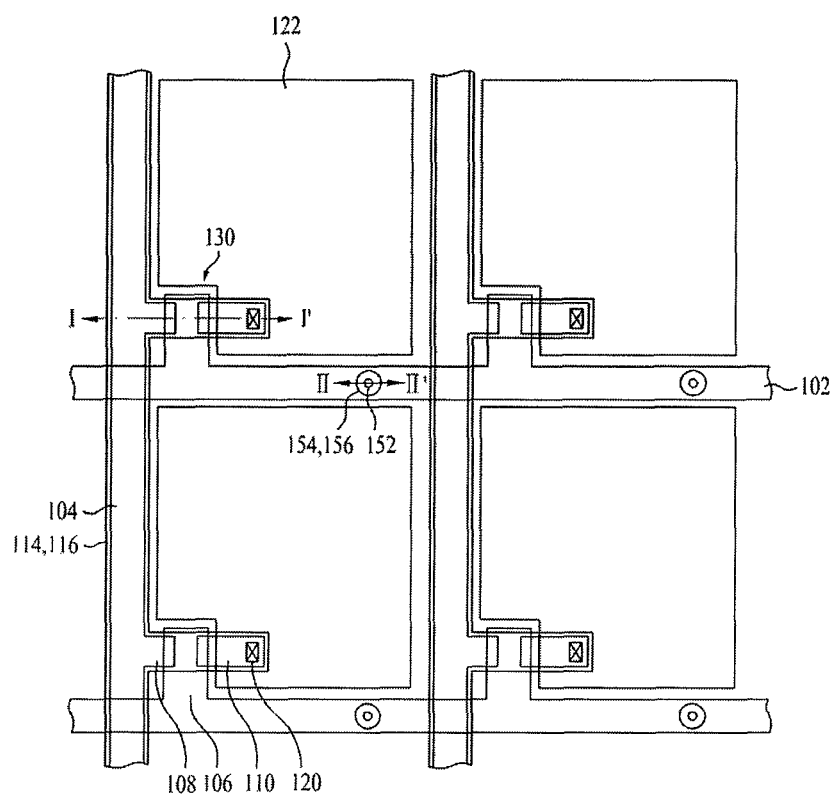
FIG. 2 illustrates a plan view of a liquid crystal display panel in accordance with a first preferred embodiment of the present invention.
Figure 3:
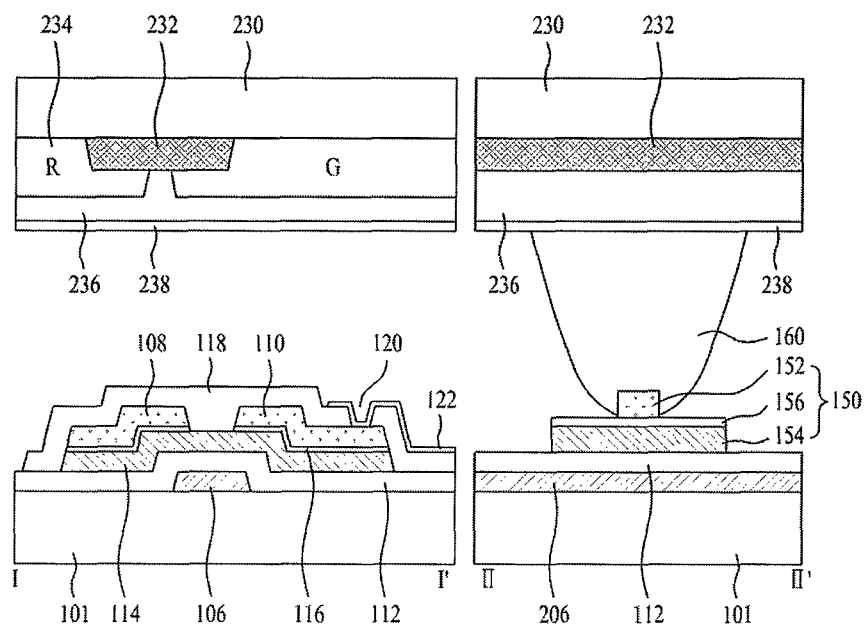
FIG. 3 illustrates sections of the liquid crystal display panel in FIG. 2 across lines I-I' and II-II', respectively.
Figure 4A:
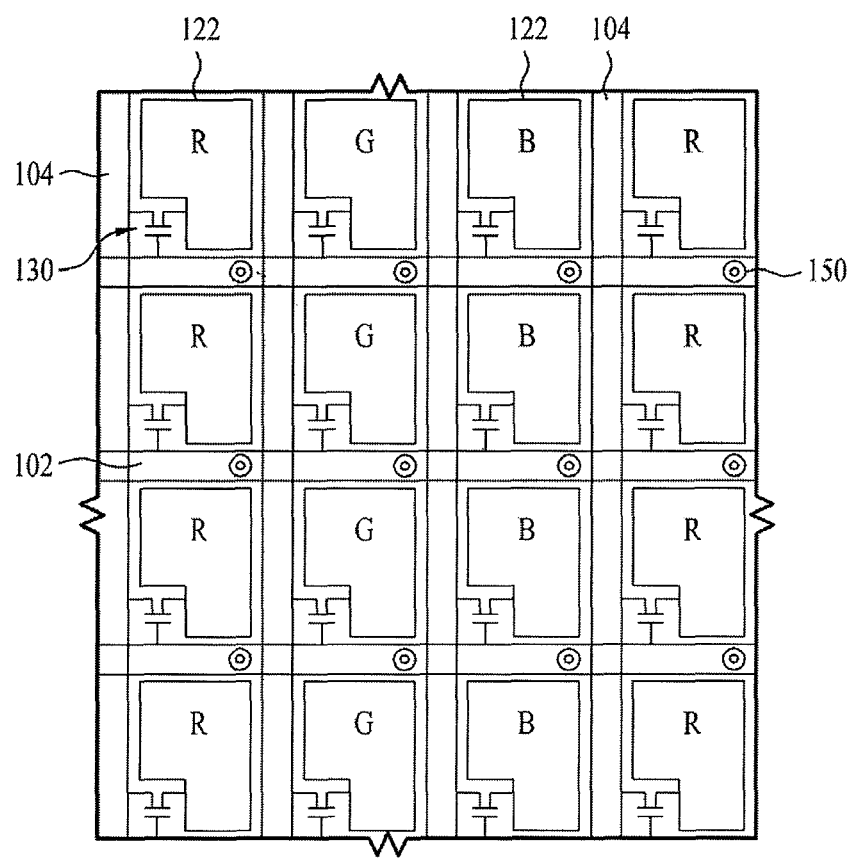
FIGS. 4A to 4C illustrate plan views each showing a projection pattern portion in accordance with a first preferred embodiment of the present invention.
Figure 4B:
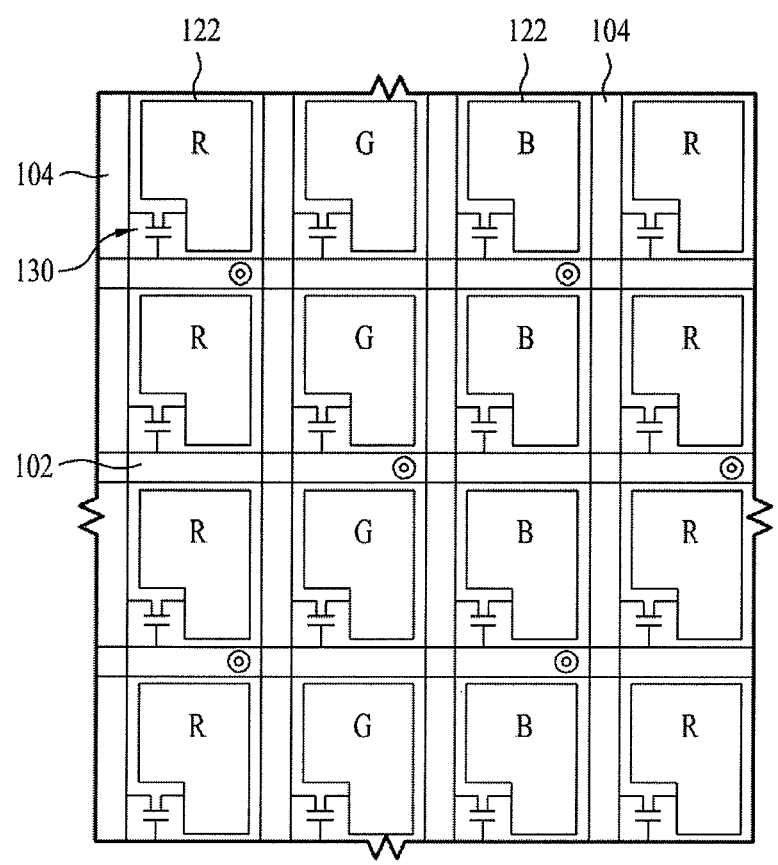
Figure 4C:
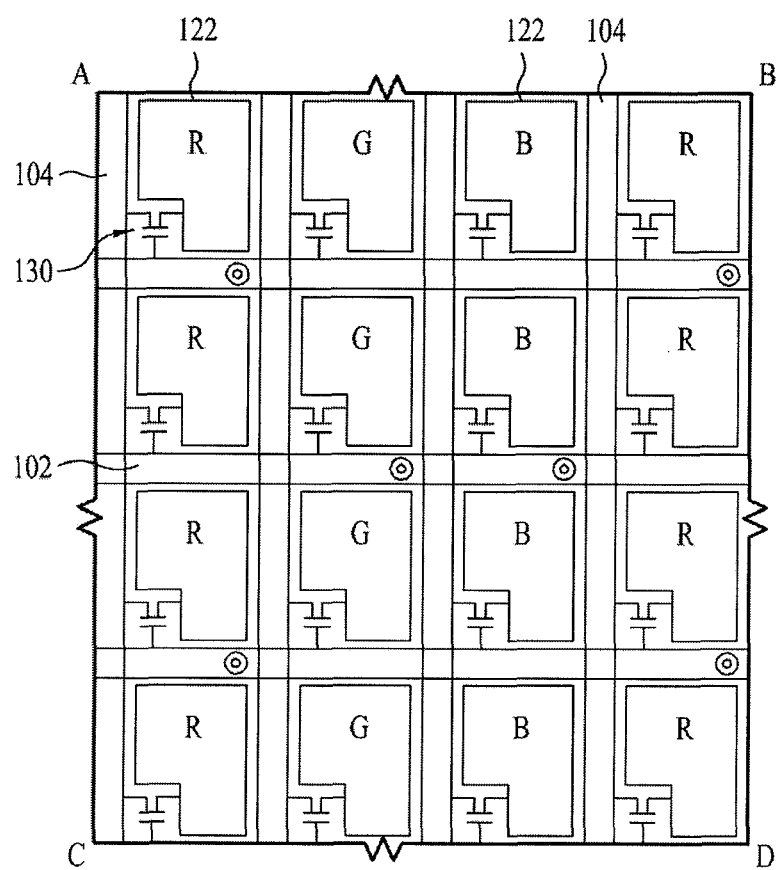
Figure 5:
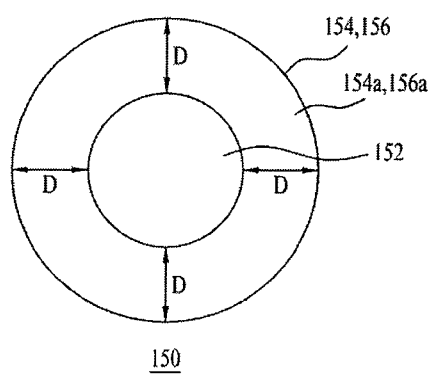
FIG. 5 illustrates an enlarged plan view of the projection pattern portion in FIG. 2 or 3.

FIG. 2 illustrates a plan view of a liquid crystal display panel in accordance with a first preferred embodiment of the present invention, and FIG. 3 illustrates sections of the liquid crystal display panel in FIG. 2 across lines I-I' and II-II', respectively. FIGS. 4A to 4C illustrate plan views each showing a projection pattern portion in accordance with a first preferred embodiment of the present invention, and FIG. 5 illustrates an enlarged plan view of the projection pattern portion in FIG. 2 or 3.

Referring to FIGS. 2 and 3, the liquid crystal display panel includes a thin film transistor substrate and a color filter substrate faced to each other with liquid crystals disposed therebetween.

The color filter substrate has a color filter array formed on an upper substrate 230 to include a black matrix 232 for preventing a light from leaking, a color filter 234 for producing a color, an overcoat layer 236 for compensating for a step caused by the color filter 234, a common electrode 238 for forming a vertical electric field to a pixel electrode 122, and column spacers 160 for maintaining a cell gap.

The color filter 234 includes red, green, and blue color filters R, G, B for producing a color. Each of the red, green, and blue color filters R, G, B absorbs or transmits a specific wavelength of light with a red, green, or blue pigment the red, green, or blue color filter includes for producing the red, green, or blue color.

The black matrix 232 is formed on the upper substrate 230 to partition a pixel region the color filter 234 is to be formed thereon, to overlap with gate lines 102, data lines 104, and thin film transistors 130 on the thin film transistor substrate. The black matrix 232 shields light transmission caused by an unwanted liquid crystal orientation to improve a contrast of the liquid crystal display device, and shields direct incident of the light on the thin film transistor 130 to prevent the light from leaking from the thin film transistor 130.

The overcoat layer 236 is formed of a transparent organic insulating material, such as acryl resin, on the color filter 234 and the black matrix 232. The overcoat layer 236 compensates for a step of the color filter 234 and the black matrix 232 to provide a flat surface.

The common electrode 238 is a transparent conductive layer coated on an entire surface of the overcoat layer 236 for supplying a common voltage Vcom which is a reference at the time of driving the liquid crystals. Thus, the common electrode 238 is formed on a substrate different from the pixel electrode 122 of the same or different material to form the vertical electric field, or on the same substrate and of the same material to form a plane electric field. The present invention illustrates the pixel electrode 122 and the common electrode 238 formed on substrates different from each other, as an example.

The column spacer 160 is formed on the common electrode 238 for maintaining the cell gap between the upper substrate 230 and the lower substrate 101. And, the column spacer 160 is supported on a projection pattern portion 150 formed on the lower substrate 101.

The thin film transistor substrate includes a thin film transistor 130 connected to a gate line 102 and a data line 104, a pixel electrode 120 formed at a pixel region provided by a crossed structure of the gate line 102 and the data line 104, and the projection pattern portion 150 for supporting the column spacer 160 formed on the upper substrate 230.

The thin film transistor 130 makes the pixel electrode 122 to be charged with, and sustain a pixel signal supplied to the data line 104 in response to a scan signal supplied to the gate line 102. For this, the thin film transistor 130 has a gate electrode 106, a source electrode 108, a drain electrode 110, an active layer 114, and an ohmic contact layer 116.

The gate electrode 106 is connected to the gate line 102 to have the scan signal supplied thereto from the gate line 102. The source electrode 108 is connected to the data line 104 to have the pixel signal supplied thereto from the data line 104. The drain electrode 110 is formed to face the source electrode 108 with a channel portion of the active layer 114 disposed therebetween, for supplying the pixel signal from the data line 104 to the pixel electrode 122. The active layer 114 is overlapped with the gate electrode 106 with a gate insulating film 112 disposed therebetween to form the channel portion between the source and drain electrodes 108 and 110. The ohmic contact layer 116 is formed between the source electrode 108 and the drain electrode 110 and the active layer 114, i.e., on the active layer 114 except the channel portion. The ohmic contact layer 116 serves to reduce electric contact resistance between the source and drain electrodes 108 and 110 and the active layer 114. A semiconductor pattern including the active layer 114 and the ohmic contact layer 116 is formed to overlap, not only with the source and drain electrodes 108 and 110, but also with a data metal pattern including a data line 104 and a data lower electrode.

The pixel electrode 122 is in contact with the drain electrode 110 of the thin film transistor 130 through a contact hole 120. According to this, the pixel electrode 122 has the pixel signal supplied thereto from the data line 104 through the thin film transistor 130.

The projection pattern portions 150 may be formed on the gate lines 102 matched with the pixel regions 122 as shown in FIG. 4A respectively, on the gate lines 102 matched with every second pixel regions 122 as shown in FIG. 4B respectively, or on the gate lines 102 matched with four corners and a center of the liquid crystal display panel which deform heavily at the time of the physical impact or vibration on the liquid crystal display panel as shown in FIG. 4C, respectively. As shown in FIGS. 2 and 4A, the projection pattern portion 150 of the first embodiment will be described taking a case in which the projection pattern portion 150 is formed on the gate line 102 matched with the pixel region 122, as an example.

The projection pattern portion 150 includes a projection 152 formed to contact with the column spacer 160 on the upper substrate 230, and a projection support pattern 154 or 156 for supporting the projection 152.

The projection 152 has a small area for reducing a friction area between the column spacer 160 and the lower substrate 101 and securing transmissivity. The projection 152 is formed in a step of forming the source and drain electrodes 108 and 110 together with the source and drain electrodes 108 and 110, on the same layer, and of the same material, with the source and drain electrodes 108 and 110.

The projection support pattern 154 or 156 prevents the column spacer 160 from being stuck in the lower substrate 101 by the physical impact. That is, if the liquid crystal display panel is in a high temperature environment, or subjected to the physical impact like a mechanical stiffness test of the liquid crystal display panel, making a load to be concentrated on the projection, the column spacer fails to return to an original state, but presses the projection 152 and the projection support pattern 154 or 156, covering the same. In this instance, since the projection support pattern 154 or 156 is formed to have an area larger than an area of the column spacer 160 pressed down on the projection 152, the column spacer 160 is not stuck in the lower substrate 101.

In detail, referring to FIG. 5, the projection support pattern 154 or 156 includes a core portion for supporting the projection 152, and a tail portion 154a or 156a around the core portion. The tail portion 154a or 156a of the projection support pattern 154 or 156 has a length D1 of 1.8 μm~5 μm such that the tail portion 154a or 156a has an area larger than a pressed down surface area of the column spacer 160 at the time of the physical impact or the vibration. As the length D1 of the tail portion 154a or 156a of the projection support pattern 154 or 156 becomes longer, an entire circular area of the projection support pattern 154 or 156 becomes larger. Thus, the length D1 of the tail portion 154a or 156a is formed long with a halftone mask, or a slit mask at the time of formation of the source and drain electrodes, and the semiconductor pattern. The projection support pattern 154 or 156 is a semiconductor layer.

As described before, the projection pattern portion 150 can secure transmissivity of the panel by reducing the area of the projection 152, and prevents the stain from taking place by improving the sticking in of the column spacer 160 caused by the physical impact or vibration.

In the meantime, though the projection 152 and the projection support pattern 154 or 156 of the projection pattern portion 150 are described taking a case in which the projection 152 and the projection support pattern 154 or 156 are formed circular as an example, the projection 152 and the projection support pattern 154 or 156 of the projection pattern portion 150 may be, but not limited to, circular, oval, rectangular, or triangular.

FIGS. 6A~12 illustrate plan views and sections for describing a method for fabricating a liquid crystal display panel in accordance with a first preferred embodiment of the present invention.

Figure 6A:
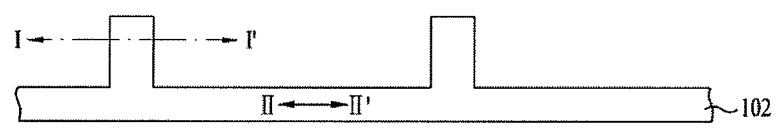
FIGS. 6A and 6B illustrate a plan view and a section for describing a gate metal pattern in a method for fabricating a liquid crystal display panel in accordance with a first preferred embodiment of the present invention, respectively.
Figure 6A:
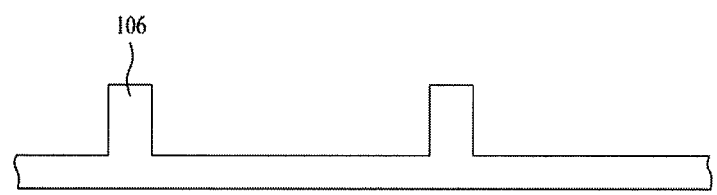
Figure 6B:
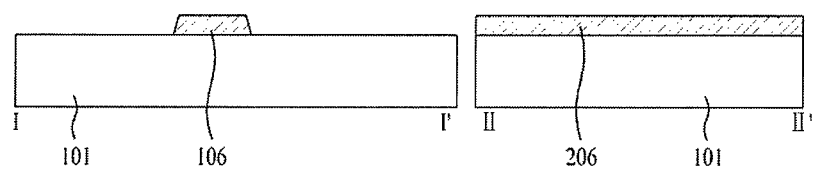

FIGS. 6A and 6B illustrate a plan view and a section for describing a gate metal pattern in a method for fabricating a liquid crystal display panel in accordance with a first preferred embodiment of the present invention, respectively.

A gate metal pattern is formed on a lower substrate 101 to include a gate line 102 and a gate electrode 106.

In detail, a gate metal layer is formed on the lower substrate 101 by deposition, such as sputtering. The gate metal layer may be single metal layer of Mo, Ti, AlNd, Al, Cr, an Mo alloy, a Cu alloy, or an Al alloy, or a stack of at least two layers of Al/Cr, Al/Mo, Al/(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy, or Mo/Al alloy. Then, the gate metal layer is patterned by photolithography and etching, to formed the gate metal pattern including the gate line 102 and the gate electrode 106.

Figure 7A:
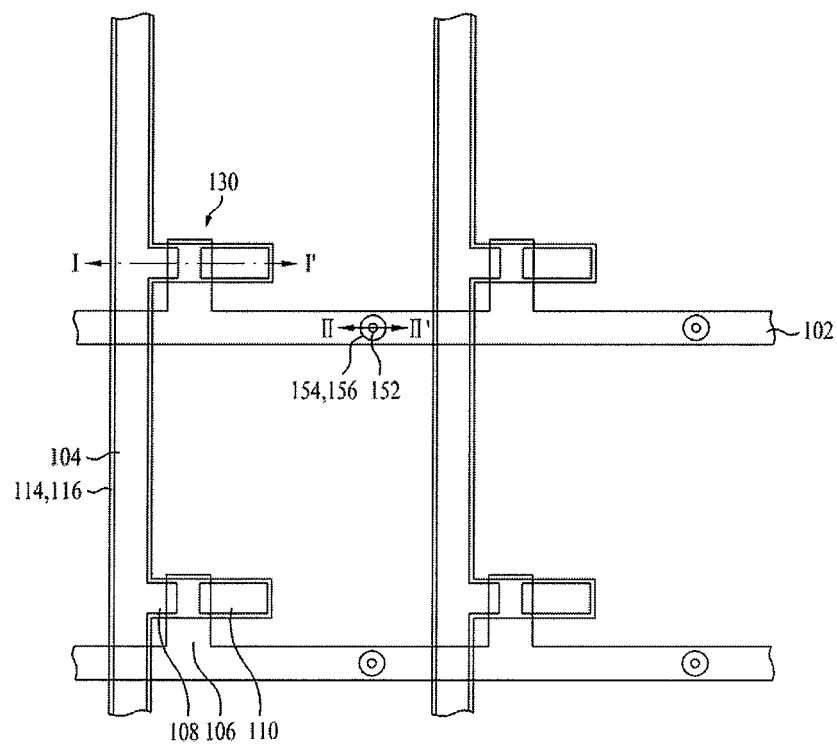
FIGS. 7A and 7B illustrate a plan view and a section for describing the steps of forming a semiconductor pattern, a data metal pattern, and a projection pattern portion in a method for fabricating a liquid crystal display panel in accordance with a first preferred embodiment of the present invention, respectively.
Figure 7B:
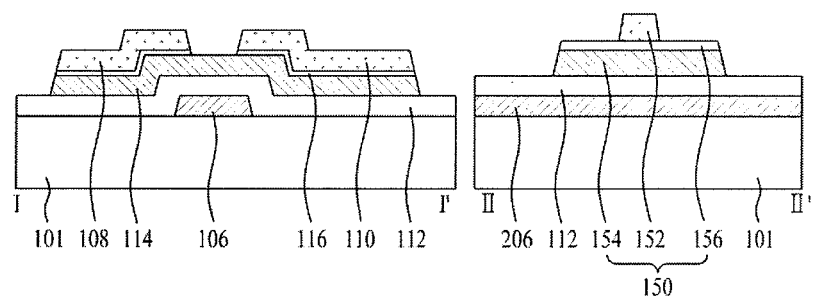
Figure 8A:
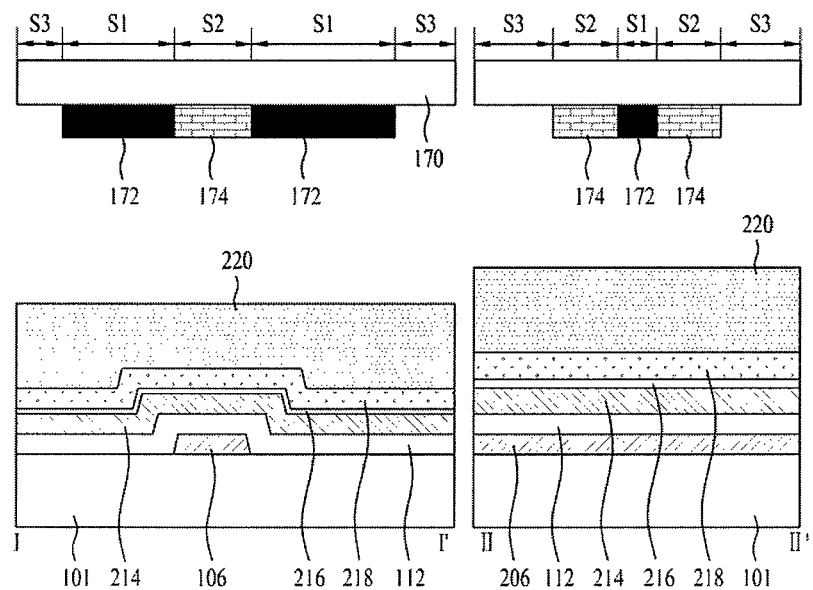
FIGS. 8A through 8E illustrate sections for describing the semiconductor pattern, the data metal pattern, and the projection pattern illustrated in FIGS. 7A and 7B, in detail.
Figure 8B:
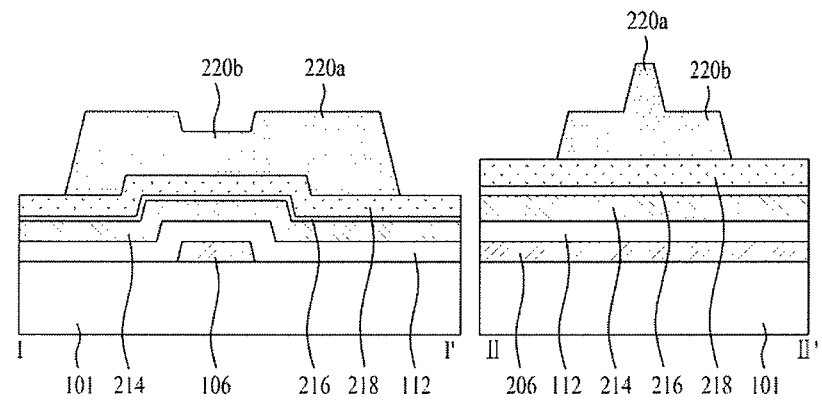
Figure 8C:
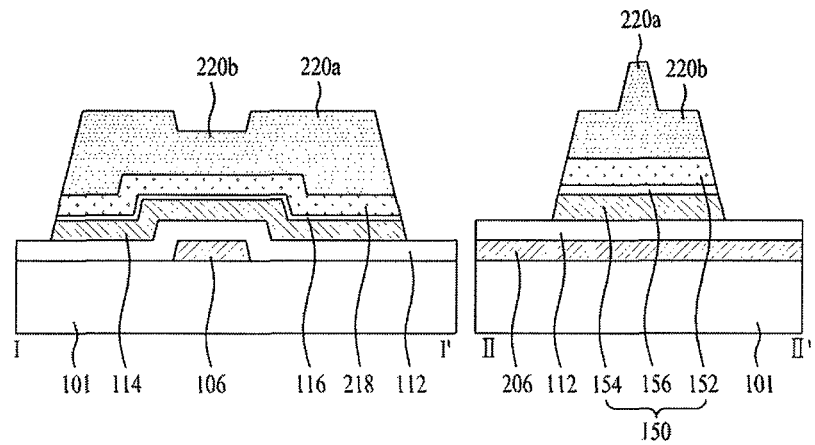
Figure 8D:
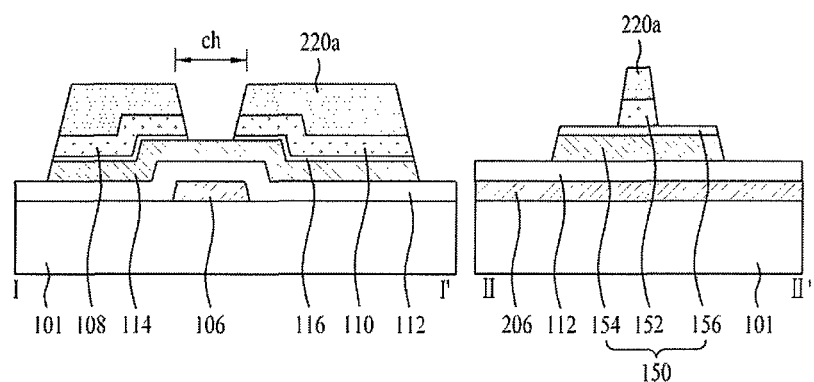
Figure 8E:
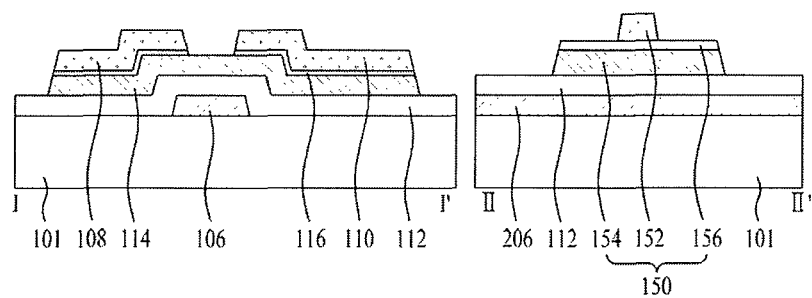

FIGS. 7A and 7B illustrate a plan view and a section for describing the step of forming a semiconductor pattern, a data metal pattern, and a projection pattern portion in a method for fabricating a liquid crystal display panel in accordance with a first preferred embodiment of the present invention respectively, and FIGS. 8A and 8E illustrate sections for describing the semiconductor pattern, the data metal pattern, and the projection pattern illustrated in FIGS. 7A and 7B, in detail.

Referring to FIG. 8A, a gate insulating film 112, an amorphous silicon layer 214, an impurity ($n^+$ or $p^+$) doped amorphous silicon layer 216, and a data metal layer 218 are formed on the lower substrate 101 having the gate metal pattern formed thereon in succession. For an example, the gate insulating film 112, the amorphous silicon layer 214, and the impurity doped amorphous silicon layer 216 are formed by PECVD, and the data metal layer 218 is formed by sputtering. The gate insulating film 112 is formed of an inorganic insulating material, such as SiOx and SiNx, and the data metal layer 218 is single metal layer of Mo, Ti, AlNd, Al, Cr, an Mo alloy, a Cu alloy, or an Al alloy, or a stack of at least two layers of Al/Cr, Al/Mo, Al/(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy, or Mo/Al alloy. Then, photoresist 220 is coated on the data metal layer 218 and subjected to exposure and development by photolithography with a slit mask or a halftone mask to form a photoresist pattern 220a or 220b having a step.

Figure 9:
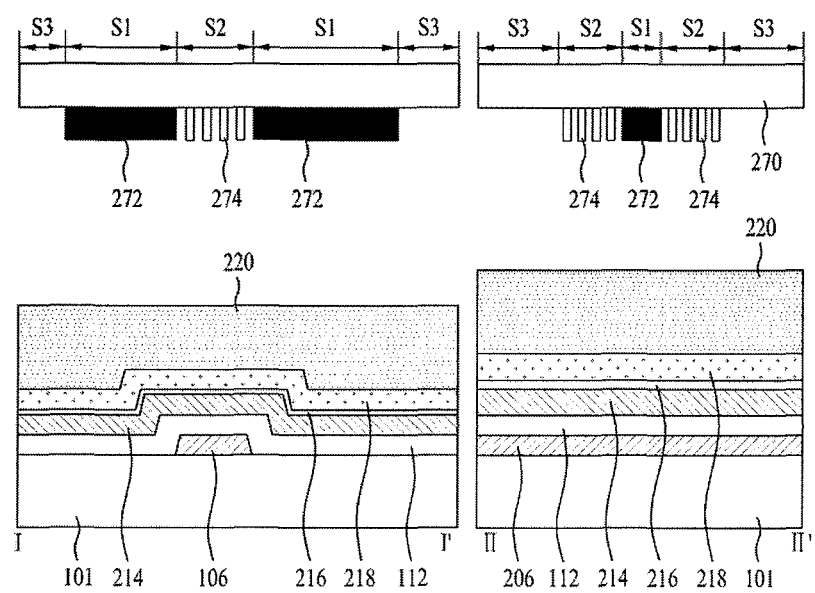
FIG. 9 illustrates a section of a slit mask for forming a semiconductor pattern, a data metal pattern, and a projection pattern portion in a method for fabricating a liquid crystal display panel in accordance with a first preferred embodiment of the present invention.

In detail, referring to FIG. 8A, the halftone mask has a shielding region S1 formed on a substrate 170 to have a shielding layer 172, a semi-transparent region S2 formed on the substrate 170 to have a semi-transmission layer 174, and a transmission layer S3 only having the substrate 170. Or, as shown in FIG. 9, a slit mask may be provided, including a shielding region S1 formed on the substrate 270 to have a shielding layer 272, a semi-transmission region S2 formed on the substrate 270 to have a plurality of slits 274, and a transmission region S3 only having the substrate 270. A case in which the halftone mask is used will be described. The shielding region S1 is positioned at a region at which the semiconductor pattern, the date metal pattern, and the projection 152 are to be formed, to shield a UV ray to leave a first photoresist pattern 220a after development as shown in FIG. 8B. The semi-transmission region S2 has the semi-transmission layer 174 stacked at a region at which a projection support pattern 154 or 156 and a channel of the thin film transistor are to be formed, for controlling light transmissivity to leave a second photoresist pattern 220b thinner than the first photoresist pattern 220a after development as shown in FIG. 8B. And, as the transmission region S3 transmits the UV ray completely, to remove the photoresist after development as shown in FIG. 8B. Thus, by controlling a length of the semi-transmission layer 174 of the halftone mask, a length D1 of the tail portion 154a or 156a of the projection support pattern 154 or 156 may be formed long. The longer the length of the semi-transmission layer 174 on the halftone mask substrate 170, the longer the length of the tail portion 154a or 156a. In this instance, the semi-transmission layer 174 may be formed such that the length D1 of the tail portion 154a or 156a of the projection support pattern 154 or 156 is formed to be 1.8 μm~5 μm.

Referring to FIG. 8C, the data metal layer 218, the amorphous silicon layer 214, and the impurity (n type or p type) doped amorphous silicon layer 216 are patterned by etching with the photoresist pattern 220a or 220b having a step, to form the data metal pattern 218, an underlying semiconductor pattern 114 or 116 as well as the projection support pattern 154 or 156. In this case, a source electrode and a drain electrode in the data metal pattern have a connected structure.

Then, referring to FIG. 8D, the photoresist pattern 220a is ashed by using oxygen plasma, to make the first photoresist pattern 220a thinner, and the second photoresist pattern 220b removed. Then, an exposed data metal layer 218 and the underlying impurity doped amorphous silicon layer 116 are removed by etching with the first photoresist pattern 220a ashed thus. According to this, the source electrode 108 and the drain electrode 110 are separated, and the active layer is exposed. And, as the tail portion of the projection support pattern 154 or 156 is exposed, the projection 152 is formed.

Then, referring to FIG. 8E, the first photoresist pattern 220a remained on the source/drain electrodes 108, 110 of the data metal pattern is removed by stripping.

Thus, since the projection pattern portion 150 including the projection 152, and the projection support pattern 154 or 156 may be formed with the halftone mask in the step of the semiconductor pattern and the data metal pattern, the fabrication process can be simplified, and by controlling an area of the semi-transmission layer of the halftone mask, the length of the tail portion of the projection support pattern may be controlled to be long.

Figure 10A:
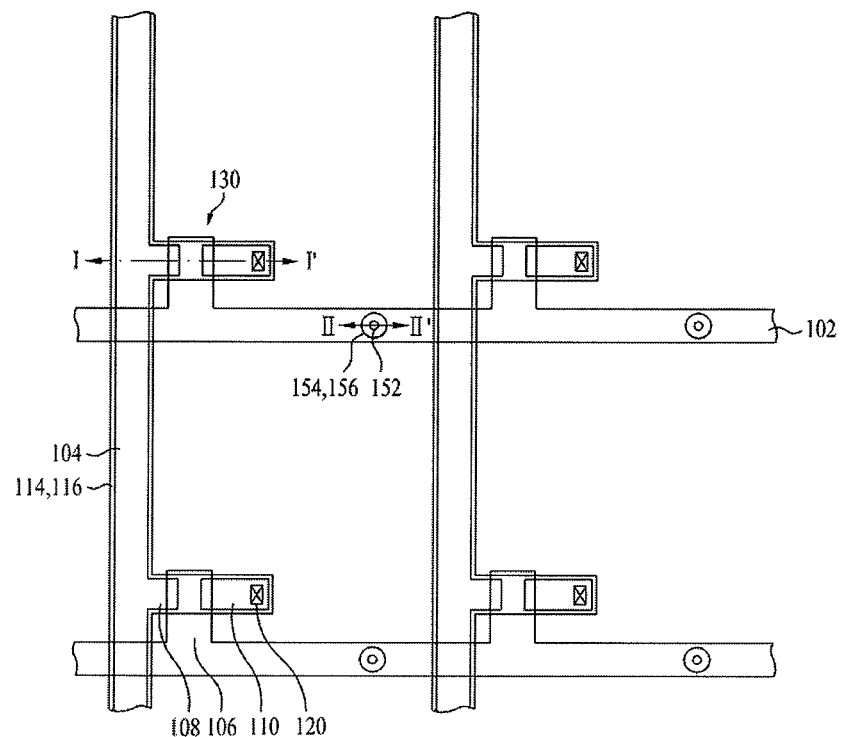
FIGS. 10A and 10B illustrate a plan and a section for describing the step of forming a protective film in a method for fabricating a liquid crystal display panel in accordance with a first preferred embodiment of the present invention, respectively.
Figure 10B:
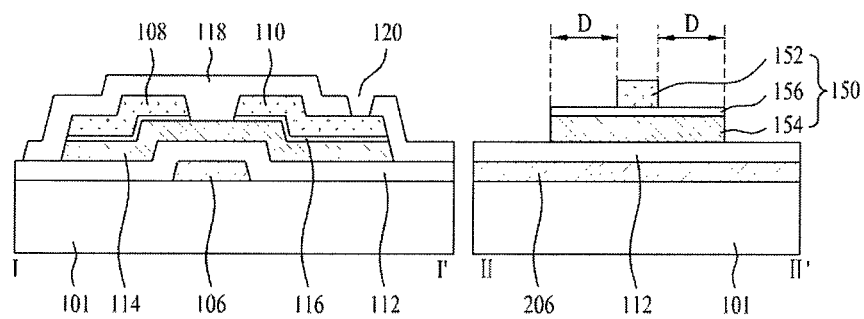

FIGS. 10A and 10B illustrate a plan and a section for describing the step of forming a protective film in a method for fabricating a liquid crystal display panel in accordance with a first preferred embodiment of the present invention, respectively.

A protective film 118 is formed on the gate insulating film 112 having the semiconductor pattern 114 or 116, the data metal pattern 108, 110, and the projection pattern portion 150 formed thereon to include a pixel contact hole 120.

In detail, a protective film 118 is formed on the gate insulating film 112 having the semiconductor pattern 114 or 116, the data metal pattern 108, 110, and the projection pattern portion 150 formed thereon. The protective film 118 is formed of an inorganic insulating material the same with the gate insulating film 112, or an organic insulating material, such as acryl resin. The protective film 118 is patterned by photolithography and etching to form a pixel control hole 120 which passes through the protective film 118. The pixel contact hole 120 is formed to expose the drain electrode 110 through the protective film 118.

Figure 11A:
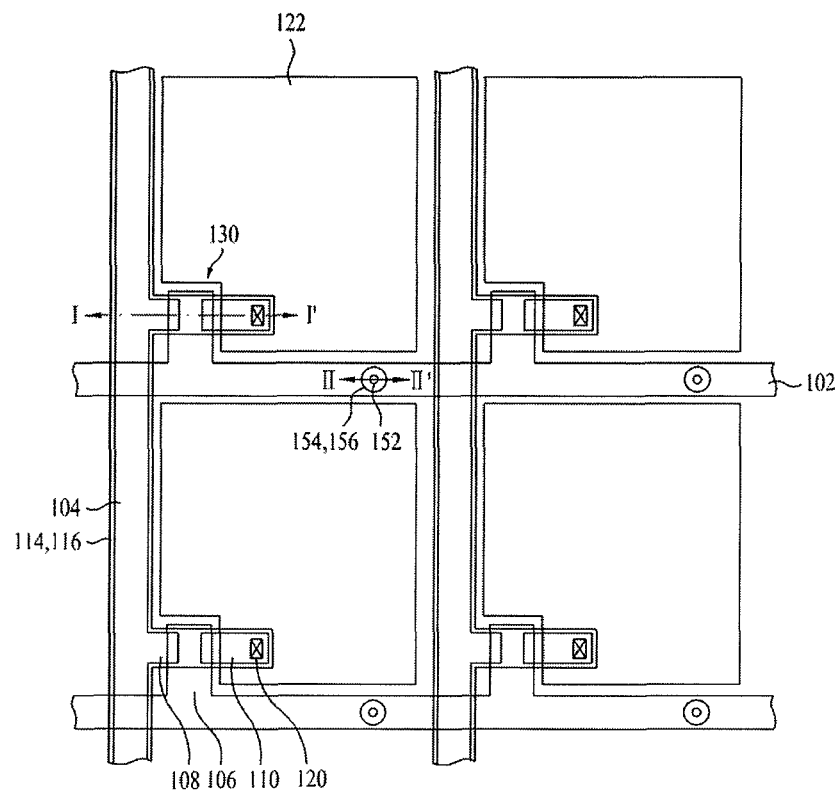
FIGS. 11A and 11B illustrate a plan and a section for describing the step of forming a pixel electrode in a method for fabricating a liquid crystal display panel in accordance with a first preferred embodiment of the present invention.
Figure 11B:
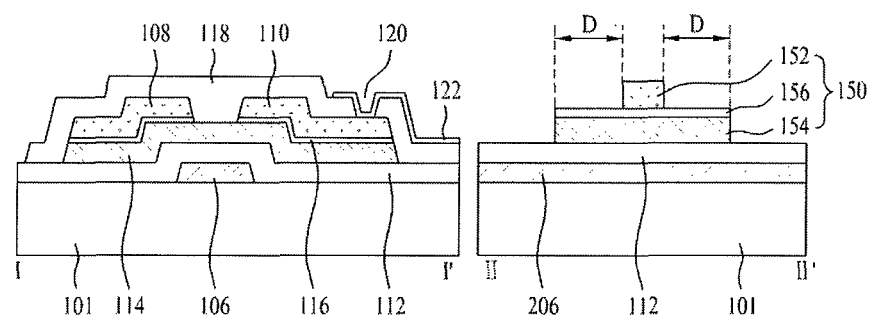

FIGS. 11A and 11B illustrate a plan and a section for describing the step of forming a pixel electrode in a method for fabricating a liquid crystal display panel in accordance with a first preferred embodiment of the present invention.

Referring to FIGS. 11A and 11B, a pixel electrode 12 is formed on the protective film 118.

In detail, a transparent conductive layer is formed on the protective film 118 by deposition, such as sputtering. The transparent conductive layer is formed of tin oxide TO, indium tin oxide ITO, indium zinc oxide IZO, or indium tin zinc oxide ITZO. The transparent conductive layer is patterned by photolithography and etching to form the pixel electrode 122.

Figure 12:
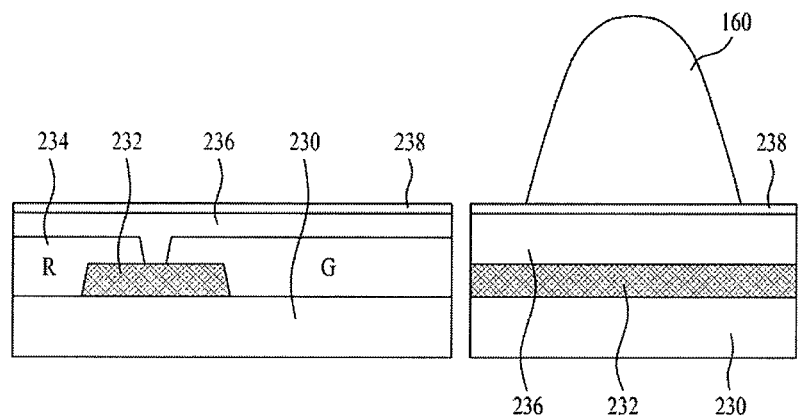
FIG. 12 illustrates a section for providing a color filter substrate in a method for fabricating a liquid crystal display panel in accordance with a first preferred embodiment of the present invention.

FIG. 12 illustrates a section for providing a color filter substrate in a method for fabricating a liquid crystal display panel in accordance with a first preferred embodiment of the present invention.

A color filter substrate is provided, having a black matrix 232 formed on the upper substrate 230 for partition pixel regions the color filters 234 are to be formed thereon respectively, red R, green G, and blue B color filters 232, an overcoat layer 236 of a transparent organic material, such as acryl resin formed to cover the black matrix 232 and the R, G, B color filter 234, a common electrode 238 of a transparent conductive layer formed on the overcoat layer 236, and a column spacer 160 formed on the common electrode to maintain a cell gap.

Figure 13:
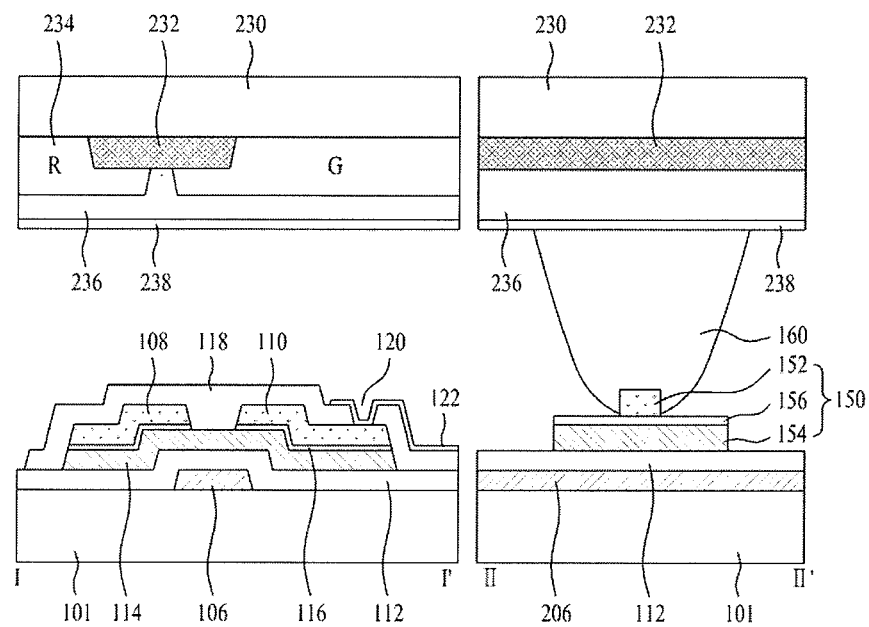
FIG. 13 illustrates a section of a liquid crystal display panel fabricated by a method for fabricating a liquid crystal display panel in accordance with a first preferred embodiment of the present invention.

Referring to FIG. 13, the thin film transistor substrate and the color filter substrate formed in the steps illustrated in FIGS. 6A~11B are bonded together to form a liquid crystal display panel. By the bonding, the column spacer on the upper substrate is brought into contact with the lower substrate.

Figure 14A:
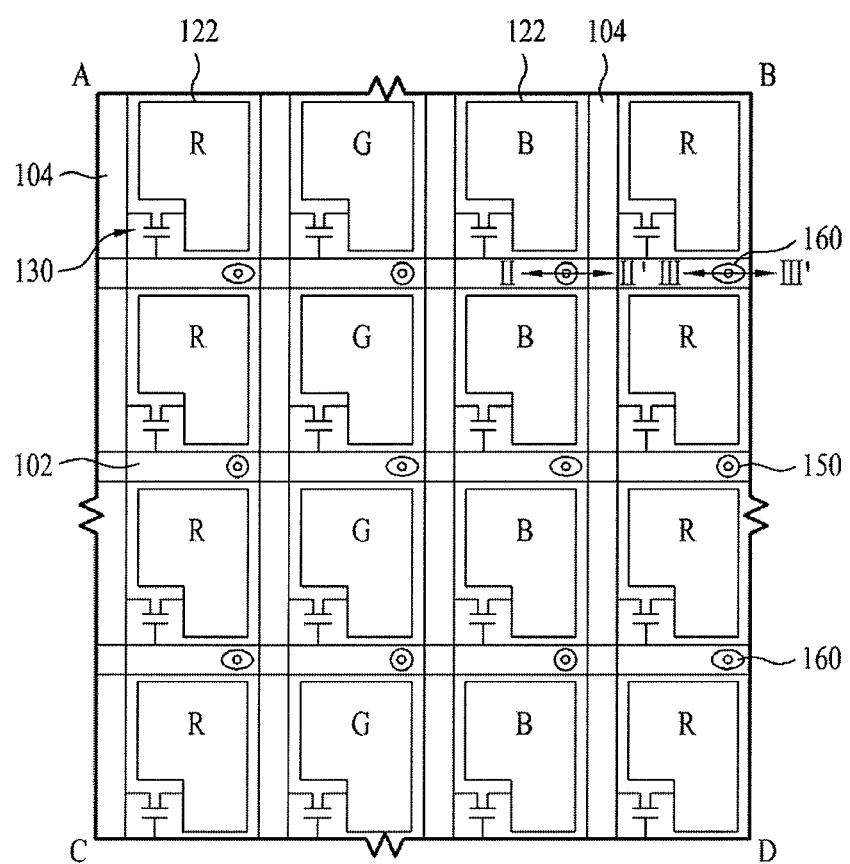
FIGS. 14A and 14B illustrate plan views each showing a liquid crystal display panel in accordance with a second preferred embodiment of the present invention.
Figure 14B:
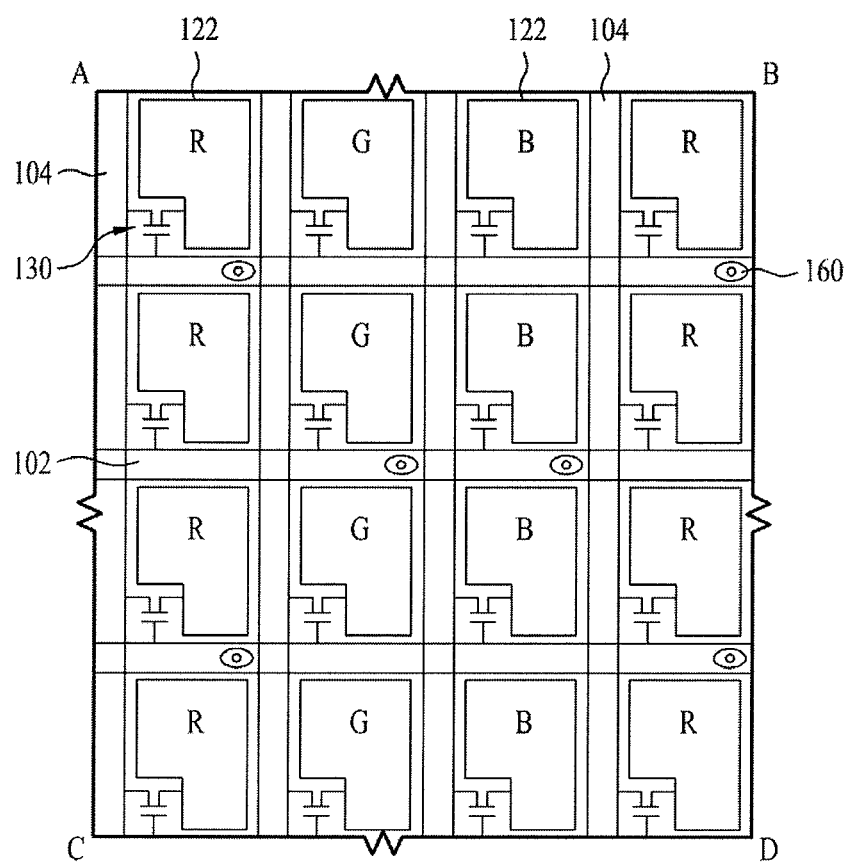
Figure 15:
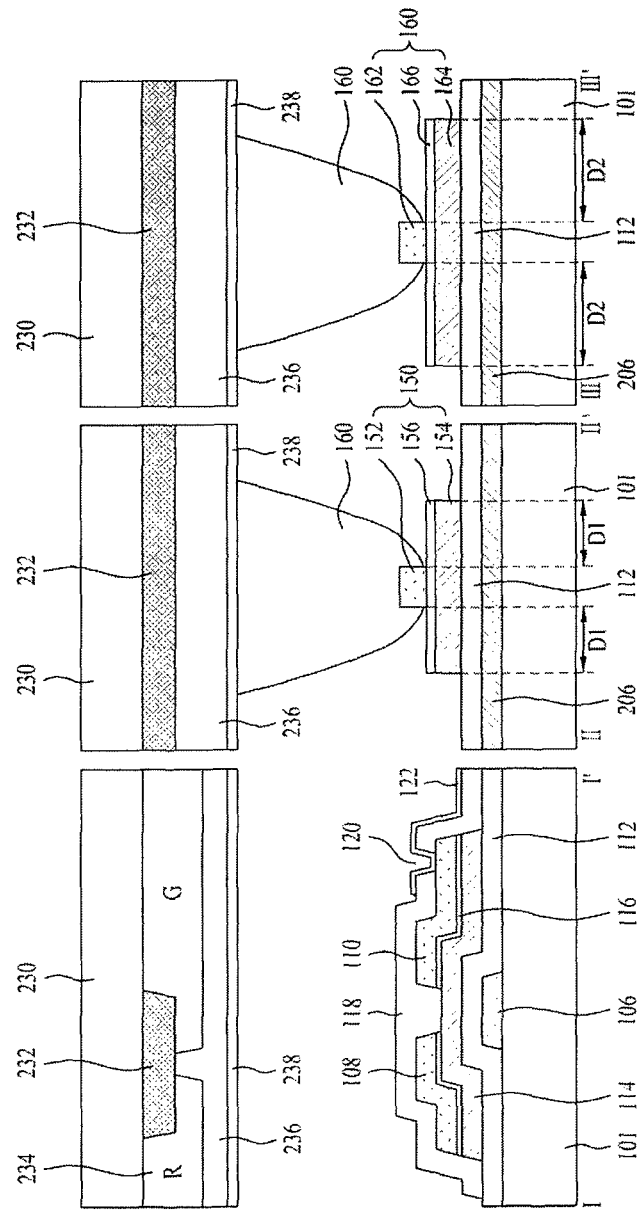
FIG. 15 illustrates sections across lines I-I', II-II', and III-III' of the liquid crystal display panel in FIG. 14A.
Figure 16:
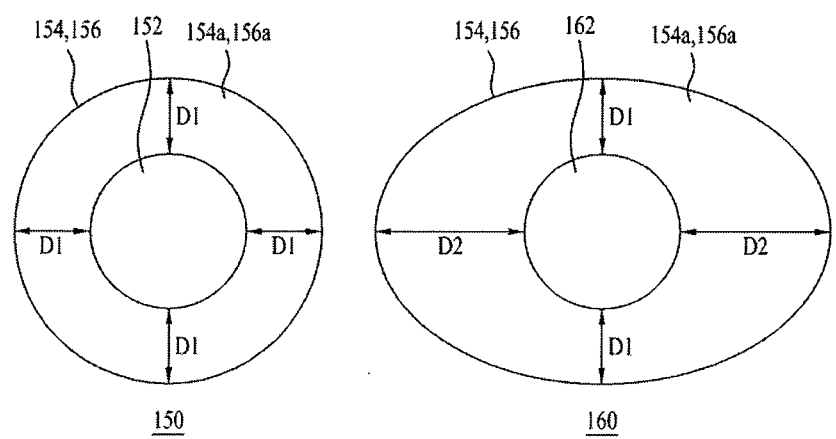
FIG. 16 illustrates enlarged views of sections of the projection pattern portions in FIG. 14A.

FIGS. 14A and 14B illustrate plan views each showing a liquid crystal display panel in accordance with a second preferred embodiment of the present invention, and FIG. 15 illustrates sections across lines I-I', II-II' and III-III' of the liquid crystal display panel in FIG. 14A. FIG. 16 illustrates enlarged views of sections of the projection pattern portions in FIG. 14A.

Since the liquid crystal display panel illustrated in FIGS. 14A, 14B or 15 has the same elements with the liquid crystal display panel illustrated in FIG. 2 or 3, detailed description of identical elements will be omitted.

Referring to FIG. 14A, a projection pattern portion 150 and 160 includes a first projection pattern portion 150 formed on gate lines 102 at pixel regions except four corners A, B, C and D and a center of the liquid crystal display panel, and a second projection pattern portion 160 formed on the gate lines 102 matched to the four corners A, B, C and D and the center of the liquid crystal display panel, each to have an area larger than an area of the first projection pattern portion 150. And, as shown in FIG. 14B, the projection pattern portion of the second embodiment may include the second projection pattern portion 160 on the gate line matched to the four corners A, B, C and D and the center of the liquid crystal display panel.

Referring to FIGS. 15 and 16, the first projection pattern portion 150 includes a first projection 152 formed to contact with the column spacer 160 for reducing a friction area between the column spacer 160 on the upper substrate 203 and the lower substrate 101, and a first projection support pattern 154 or 156 which supports the first projection 152. The first projection 152 is formed of the same material, and on the same layer with the source and drain electrodes 108 and 110, and the first projection support pattern 154 or 156 is formed of the same material and on the same layer with the semiconductor pattern 114 or 116.

The second projection pattern portion 160 includes a second projection 162 formed to contact with the column spacer 160 for reducing a friction area between the column spacer 160 on the upper substrate 203 and the lower substrate 101, and a second projection support pattern formed to have an area larger than the area of the first projection support pattern for supporting the second projection 162. In detail, as shown in FIGS. 15 and 16, a left/right direction D2 length of the tail portion 164a or 166a of the second projection support pattern is formed longer than a left/right direction D1 length of the tail portion 154a or 156a of the first projection support pattern. The second projection 162 is formed of the same material, and on the same layer with the source and drain electrodes 108 and 110, and the second projection support pattern 164 or 166 is formed of the same material and on the same layer with the semiconductor pattern. The first projection pattern portion 150 and the second projection pattern portion 160 are formed with the halftone mask or the slit mask having semi-transmission portions different from each other in the step of forming the data metal pattern and the semiconductor.

Thus, by forming the length of the tail portion of the second projection support pattern 164 or 166 longer than the length of the tail portion of the first projection support pattern 154 or 156, the problem of the column spacer 160 stuck in the projection 152 or 162 at regions the physical impact or the vibration affects heavily can be solved more effectively, preventing the accidental stain from taking place.

The method for fabricating a liquid crystal display panel in accordance with the second preferred embodiment of the present invention is identical to the method for fabricating a liquid crystal display panel in accordance with the first preferred embodiment of the present invention except that the method for fabricating a liquid crystal display panel in accordance with the second preferred embodiment of the present invention forms first and second projection pattern portions when the semiconductor pattern and the data metal pattern are formed. Therefore, the steps for forming the first and second projection pattern portions, the semiconductor pattern, and the data metal pattern in the method for fabricating a liquid crystal display panel in the method in accordance with the second preferred embodiment of the present invention will be described in detail, with reference to FIGS. 17A~17E.

Figure 17A:
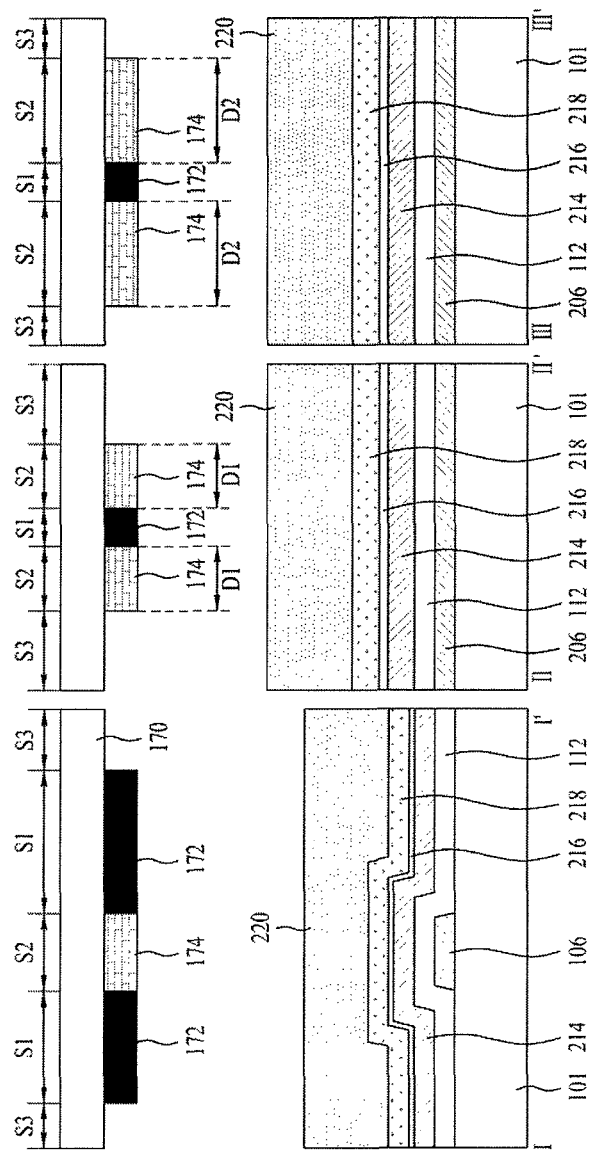

Referring to FIG. 17A, a gate insulating film 112, an amorphous silicon layer 214, an impurity ($n^+$ or $p^+$) doped amorphous silicon layer 216, and a data metal layer 218 are formed on the lower substrate 101 having the gate metal pattern formed thereon in succession. For an example, the gate insulating film 112, the amorphous silicon layer 214, and the impurity doped amorphous silicon layer 216 are formed by PECVD, and the data metal layer 218 is formed by sputtering.

The gate insulating film 112 is formed of an inorganic insulating material, such as SiOx and SiNx, and the data metal layer 218 is single metal layer of Mo, Ti, AlNd, Al, Cr, an Mo alloy, a Cu alloy, or an Al alloy, or a stack of at least two layers of Al/Cr, Al/Mo, Al/(Nd)/Al, Al(Nd)/Cr, Mo/Al(Nd)/Mo, Cu/Mo, Ti/Al(Nd)/Ti, Mo/Al, Mo/Ti/Al(Nd), Cu alloy/Mo, Cu alloy/Al, Cu alloy/Mo alloy, Cu alloy/Al alloy, Al/Mo alloy, Mo alloy/Al, Al alloy/Mo alloy, Mo alloy/Al alloy, or Mo/Al alloy. Then, photoresist 220 is coated on the data metal layer 218 and subjected to exposure and development by photolithography with a slit mask or a halftone mask to form a photoresist pattern 220a or 220b having a step.

Figure 17B:
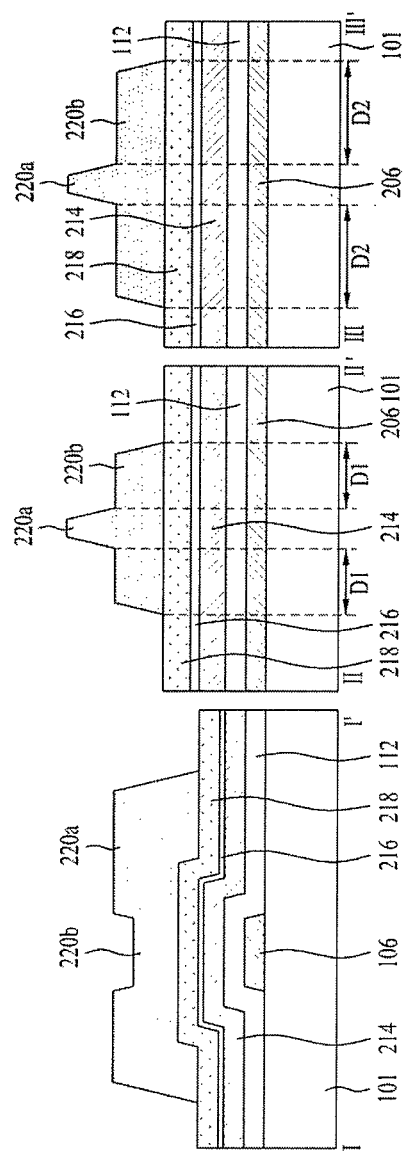

In detail, referring to FIG. 17A, the halftone mask has a shielding region S1 formed on a substrate 170 to have a shielding layer 172, a semi-transparent region S2 formed on the substrate 170 to have a semi-transmission layer 174, and a transmission layer S3 only having the substrate 170. The shielding region S1 is positioned at a region at which the semiconductor pattern 114 or 116, the date metal pattern 108 or 110, and the projection 152 are to be formed, to shield a UV ray to leave a first photoresist pattern 220a after development as shown in FIG. 17B. The semi-transmission region S2 has the semi-transmission layer 174 stacked at a region at which a channel ch of the thin film transistor, and first and second projection support pattern 154 or 156 and 164 or 166 are to be formed, for controlling light transmissivity to leave a second photoresist pattern 220b thinner than the first photoresist pattern 220a after development as shown in FIG. 17B. In this instance, a length D2 of the semi-transparent layer 174 which is to form the second projection support pattern 164 or 166 is formed longer than a length D1 of the semi-transparent layer 174 which is to form the first projection support pattern 154 or 156. In detail, as shown in FIG. 16, the semi-transparent layer is formed such that the length of each of the left, right, upper, and lower tail portions 154a or 156a of the first projection support pattern 154 or 156 is formed to be a first length D1, the semi-transparent layer 174 is formed such that the length of each of the left, and right tail portions 164a or 166a of the second projection support pattern 164 or 166 is formed to be a second length D2, and the semi-transparent layer 174 is formed such that the length of each of the upper, and lower tail portions 164a or 166a of the second projection support pattern 164 or 166 is formed to be the first length D1. And, as the transmission region S3 transmits the UV ray completely, to remove the photoresist after development as shown in FIG. 17B. Thus, by controlling the length of the semi-transmission layer 174 of the halftone mask, the length of each of the tail portions 154a or 156a and 164a or 166a of the first and second projection support patterns 154 or 156 and 164 or 166 may be formed to have the first projection support pattern 154 or 156 and the second projection support pattern 164 or 166 having lengths different from each other. In this instance, the semi-transmission layer may be formed such that the length of the tail portion 154a, 156a, 164a or 166a of the projection support pattern 154, 156, 164 or 166 is formed to be 1.8 μm~5 μm.

Figure 17C:
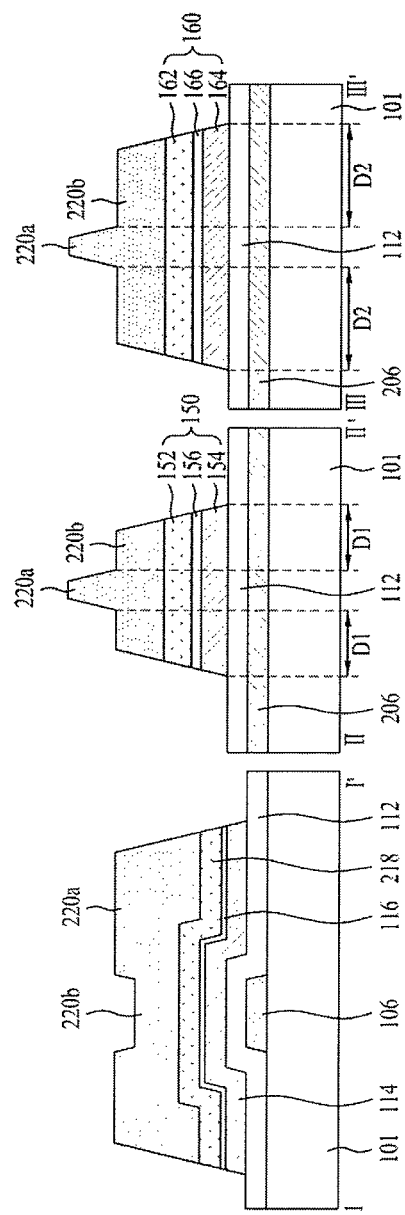

Referring to FIG. 17C, the data metal layer 218, the amorphous silicon layer 214, and the impurity (n type or p type) doped amorphous silicon layer 216 are patterned by etching with the photoresist pattern 220a or 220b having a step, to form the data metal pattern 108 or 110, an underlying semiconductor pattern 114 or 116 as well as the first and second projection support patterns 154, 156 and 164 or 166 having lengths different from each other. In the meantime, a source electrode and a drain electrode in the data metal pattern have a connected structure.

Figure 17D:
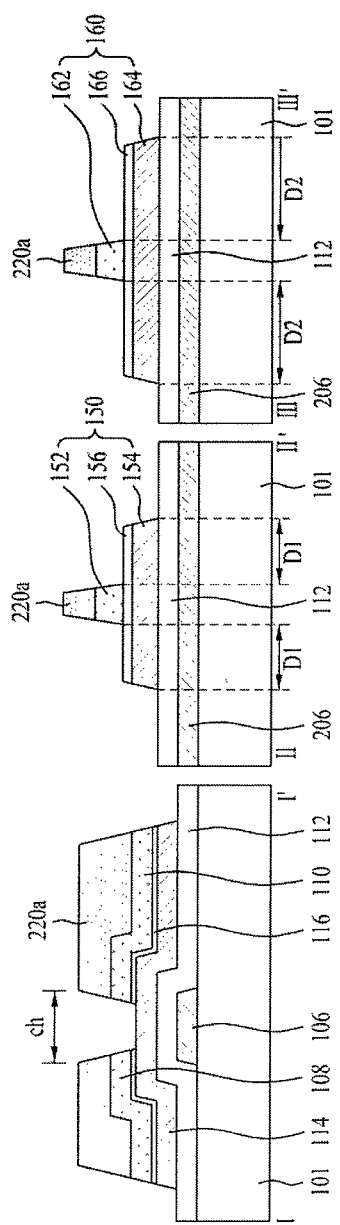

Then, referring to FIG. 17D, the photoresist pattern 220a is ashed by using oxygen plasma, to make the first photoresist pattern 220a thinner, and the second photoresist pattern 220b removed. Then, an exposed data metal layer and the underlying impurity doped amorphous silicon layer are removed by etching with the first photoresist pattern 220a ashed thus. According to this, the source electrode 108 and the drain electrode 110 are separated, and the active layer 114 is exposed. And, as the tail portion of the first projection support pattern 154 or 156 and the tail portion of the second projection support pattern 164 or 166 are exposed, the first and second projections 152 and 162 are formed.

Then, referring to FIG. 17E, the first photoresist pattern 220a remained on the data metal pattern is removed by stripping.

Thus, since the projection pattern portions 150 and 160 including the first and second projections 152 and 162, and the first and second projection support patterns 154 or 156 and 164 or 166 may be formed with the halftone mask in the step of the semiconductor pattern and the data metal pattern, the fabrication process can be simplified, and by controlling an area of the semi-transmission layer of the halftone mask, the length of the tail portion of the projection support pattern may be controlled to be long.

As has been described, the liquid crystal display panel, and the method for fabricating the same of the present invention have the following advantages.

Since the liquid crystal display panel, and the method for fabricating the same of the present invention of the present invention includes a projection formed to be in contact with the column space for reducing a friction area between the column spacer and the lower substrate, and a projection support pattern formed to have an area larger than a surface area of a force applied to the column spacer at the time of physical impact or vibration for supporting the projection. Accordingly, the present invention can secure transmissivity of the panel by reducing the area of the projection as well as prevent the accidental stain from taking place by improving the stuck in of the column spacer caused by the physical impact.

And, the halftone mask or the slit mask applied in the formation of the tail portion of the projection support pattern permits to reduce a number of fabrication steps.

And, the formation of the projection support pattern at regions matched to four corners and a center of the liquid crystal display panel to which the physical impact or vibration is applied heavier than other places larger than the regions descried above permits to prevent the stuck in from taking place by the physical impact or the vibration.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A liquid crystal display panel comprising:
a column spacer formed on an upper substrate;
a thin film transistor formed on a lower substrate to face the upper substrate connected to a plurality of gate lines and a plurality of data lines;
a pixel electrode formed at a pixel region provided as the gate line and the data line cross, the pixel electrode connected to the thin film transistor; and
a projection pattern portion formed on the gate line matched to the pixel region, wherein the projection pattern portion comprises a projection formed to be in contact with the column spacer for reducing a friction area between the column spacer and the lower substrate, and a projection support pattern for preventing the column spacer from being stuck in at the time of an physical impact or vibration.

2. The liquid crystal display panel as claimed in claim 1, wherein the projection pattern portion is formed on the gate lines matched with the pixel regions, formed on the gate lines matched with every second pixel regions, or formed on the gate lines matched with four corners and a center of the liquid crystal display panel.

3. The liquid crystal display panel as claimed in claim 1, wherein the projection pattern portion is formed with a halftone mask or a slit mask in formation of a source electrode, a drain electrode, and a semiconductor pattern of the thin film transistor.

4. The liquid crystal display panel as claimed in claim 2, wherein the projection is formed at the same time, on the same layer, and of the same material, with the source electrode and the drain electrode of the thin film transistor.

5. The liquid crystal display panel as claimed in claim 2, wherein the projection support pattern is formed at the same time, on the same layer, and of the same material, with the semiconductor pattern of the thin film transistor.

6. The liquid crystal display panel as claimed in claim 1, wherein the projection pattern portion includes:
a core portion for supporting the projection, and
a tail portion formed around the core portion.

7. The liquid crystal display panel as claimed in claim 6, wherein the tail portion of the projection support pattern has a length of 1.8 µm~5 µm.

8. A method for fabricating a liquid crystal display panel, comprising the steps of:
forming a column spacer on an upper substrate;
forming a gate electrode pattern on a lower substrate facing the upper substrate to include a gate line and a gate electrode;
depositing a gate insulating film, a semiconductor layer, and a data electrode layer on the lower substrate having the gate electrode pattern formed thereon;
forming first and second photoresist patterns having thicknesses different from each other on the gate insulating film, the semiconductor layer, and the data electrode layer;
etching the semiconductor layer, and the data electrode layer with the first and second photoresist patterns to form a data metal pattern including a source electrode and a drain electrode, and an underlying semiconductor pattern, and a projection pattern portion having a projection with the source and drain electrodes, and a projection support pattern having a semiconductor pattern formed to have an area larger than a pressed down surface area of the column spacer when the column spacer is pressed down on the projection at the time of a physical impact or vibration; and
bonding the upper substrate with the lower substrate to bring the column spacer into contact with the projection.

9. The method as claimed in claim 8, wherein the projection pattern portion includes:
a core portion for supporting the projection, and
a tail portion formed around the core portion.

10. The method as claimed in claim 9, wherein the tail portion of the projection support pattern has a length of 1.8 µm~5 µm for preventing the column spacer from being stuck in at the time of a physical impact or vibration.

11. The method as claimed in claim 8, wherein the projection pattern portion is formed on the gate lines matched with the pixel regions, formed on the gate lines matched with every second pixel regions, or formed on the gate lines matched with four corners and a center of the liquid crystal display panel.

12. The method as claimed in claim 8, wherein the step of forming first and second photoresist patterns having thicknesses different from each other on the gate insulating film, the semiconductor layer, and the data electrode layer, includes the steps of:

coating photoresist on the gate insulating film, the semiconductor layer, and the data electrode layer, providing a halftone mask or a slit mask including, a shielding region at a region at which the semiconductor pattern, the date metal pattern, and the projection are to be formed, to shield a UV ray, a semi-transmission region having a semi-transmission layer at a region at which a projection support pattern and a channel of the thin film transistor are to be formed, for controlling light transmissivity, and a transmission region for transmission of the UV ray completely, and forming first and second photoresist patterns with the halftone mask or the slit mask.

13. A liquid crystal display panel comprising:

a column spacer formed on an upper substrate;

a thin film transistor formed on a lower substrate connected to a plurality of gate lines and a plurality of data lines;

a pixel electrode formed at a pixel region provided as the gate line and the data line cross, the pixel electrode connected to the thin film transistor; and a projection pattern portion including:

a first projection pattern portion formed on the gate line matched to the pixel region, and a second projection pattern portion formed on the gate line matched to a peripheral region, or a center of the liquid crystal display panel except the gate line the first projection pattern portion is formed thereon to have an area larger than an area of the first projection pattern portion.

14. The liquid crystal display panel as claimed in claim 13, wherein the first projection pattern portion includes:

a first projection provided to contact with the column spacer for reducing a friction area between the column spacer on the upper substrate and the lower substrate, and a first projection support pattern for supporting the first projection.

15. The liquid crystal display panel as claimed in claim 14, wherein the second projection pattern portion includes:

a second projection provided to contact with the column spacer for reducing a friction area between the column spacer on the upper substrate and the lower substrate, and a second projection support pattern formed to have an area larger than an area of the first projection support pattern for supporting the second projection.

16. The liquid crystal display panel as claimed in claim 15, wherein the first projection support pattern has a tail portion with a left/right direction length formed longer than a left/right direction length of a tail portion of the second projection support pattern.

17. The liquid crystal display panel as claimed in claim 16, wherein each of the length of the tail portion of the first projection support pattern and the length of the tail portion of the second projection support pattern is 1.8 μm~5 μm for preventing the column spacer from being stuck in at the time of a physical impact or vibration.

18. A method for fabricating a liquid crystal display panel comprising the steps of:

forming a column spacer on an upper substrate;

forming a gate electrode pattern on a lower substrate facing the upper substrate to include a gate line and a gate electrode;

depositing a gate insulating film, a semiconductor layer, and a data electrode layer on the lower substrate having the gate electrode pattern formed thereon;

forming first and second photoresist patterns having thicknesses different from each other on the gate insulating film, the semiconductor layer, and the data electrode layer;

etching the semiconductor layer, and the data electrode layer with the first and second photoresist patterns to form a projection pattern portion including a data metal pattern having a source electrode and a drain electrode, and an underlying semiconductor pattern, a first projection pattern portion on the gate line, and a second projection pattern portion on the gate line matched to a peripheral region or a center except the gate line having the first projection pattern portion formed thereon to have an area larger than an area of the first projection pattern portion; and bonding the upper substrate with the lower substrate to bring the column spacer into contact with the first and second projections.

19. The method as claimed in claim 18, wherein the first projection pattern portion includes:

a first projection provided to contact with the column spacer for reducing a friction area between the column spacer on the upper substrate and the lower substrate, and a first projection support pattern for supporting the first projection.

20. The method as claimed in claim 19, wherein the second projection pattern portion includes:

a second projection provided to contact with the column spacer for reducing a friction area between the column spacer on the upper substrate and the lower substrate, and a second projection support pattern formed to have an area larger than an area of the first projection support pattern for supporting the second projection.

21. The method as claimed in claim 20, wherein the second projection pattern has a tail portion with a length formed longer than a length of a tail portion of the first projection pattern portion.

22. The method as claimed in claim 21, wherein each of the length of the tail portion of the first projection support pattern and the length of the tail portion of the second projection support pattern is 1.8 μm~5 μm for preventing the column spacer from being stuck in at the time of a physical impact or vibration.

* * * * *